(12) United States Patent
Kent

(10) Patent No.: US 8,336,419 B2
(45) Date of Patent: Dec. 25, 2012

(54) HUB ASSEMBLY FOR ROBOTIC ARM HAVING PIN SPACERS

(75) Inventor: Richard J. Kent, Newbury, NH (US)

(73) Assignee: Fabworx Solutions, Inc., Austin, TX (US)

( * ) Notice: Subject to any disclaimer, the term of this patent is extended or adjusted under 35 U.S.C. 154(b) by 527 days.

(21) Appl. No.: 12/689,976

(22) Filed: Jan. 19, 2010

(65) Prior Publication Data

US 2010/0154580 A1     Jun. 24, 2010

Related U.S. Application Data

(63) Continuation-in-part of application No. 11/102,104, filed on Apr. 8, 2005, now abandoned.

(60) Provisional application No. 60/560,798, filed on Apr. 8, 2004.

(51) Int. Cl.
*B25J 17/00* (2006.01)
*B25J 17/02* (2006.01)
*B25J 18/00* (2006.01)

(52) U.S. Cl. .................. 74/490.05; 901/27; 901/50
(58) Field of Classification Search ............. 74/490.01, 74/490.05, 490.06; 901/27, 29, 50
See application file for complete search history.

(56) References Cited

U.S. PATENT DOCUMENTS

| 6,350,097 | B1 * | 2/2002 | Mitchell et al. ............... 414/217 |
| 7,536,931 | B2 * | 5/2009 | Saito .......................... 74/490.05 |
| 7,850,414 | B2 * | 12/2010 | Uratani et al. ............. 414/744.2 |
| 7,987,742 | B2 * | 8/2011 | Tachibana et al. ......... 74/490.01 |
| 8,137,048 | B2 * | 3/2012 | Chidambaram et al. ... 414/744.2 |
| 2010/0278623 | A1 * | 11/2010 | Blank et al. ................ 414/749.1 |

* cited by examiner

*Primary Examiner* — Justin Krause
(74) *Attorney, Agent, or Firm* — Fortkort & Houston P.C.; John A. Fortkort

(57) ABSTRACT

A robotic hub assembly is provided which comprises a spacer configuration (101) that includes first (103) and second (105) spacers disposed in opposing relation to each other, and a device, such as a pin (111), for restricting the relative motion of the first and second spacers in a lateral direction.

21 Claims, 15 Drawing Sheets

HUB ASSEMBLY FOR ROBOTIC ARM HAVING PIN SPACERS

CROSS-REFERENCE TO RELATED APPLICATION

The present application is a continuation-in-part of U.S. Ser. No. 11/102,104, entitled "Hub Assembly for Robotic Arm Having Pin Spacers", which was filed on Apr. 8, 2005 now abandoned, and which is incorporated herein by reference in its entirety, and which claims priority from U.S. Ser. No. 60/560,798, entitled "Hub Assembly for Robotic Arm Having Pin Spacers", which was filed on Apr. 8, 2004, and which is incorporated herein by reference in its entirety.

This application claims the benefit of priority from U.S. patent application Ser. No. 11/102,104, filed Apr. 8, 2005, having the same inventor and having the same title, and which is incorporated herein in its entirety.

TECHNICAL FIELD OF THE INVENTION

The present application pertains generally to semiconductor wafer processing equipment, and more particularly to robotic hub assemblies.

BACKGROUND OF THE INVENTION

Modern semiconductor processing systems include cluster tools that integrate a number of process chambers together in order to perform several sequential processing steps without removing the substrate from the highly controlled processing environment. These chambers may include, for example, degas chambers, substrate pre-conditioning chambers, cooldown chambers, transfer chambers, chemical vapor deposition chambers, physical vapor deposition chambers, and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them, one by one, through a series of chambers or process steps. The process recipes and sequences will typically be programmed into a microprocessor controller that will direct, control and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

One example of a fabrication system is the cluster tool disclosed in U.S. 6,222,337 (Kroeker et al.), and reproduced in FIGS. 1 and 2 herein. The magnetically coupled robot disclosed therein comprises a frog-leg type connection or arms between the magnetic clamps and the wafer blade to provide both radial and rotational movement of the robot blade within a fixed plane. Radial and rotational movements can be coordinated or combined in order to pickup, transfer and deliver substrates from one location within the cluster tool to another, such as from one chamber to an adjacent chamber.

FIG. 1 is a schematic diagram of the integrated cluster tool 10 of Kroeker et al. Substrates are introduced into and withdrawn from the cluster tool 10 through a cassette loadlock 12. A robot 14 having a blade 17 is located within the cluster tool 10 to transfer the substrates from one process chamber to another, for example cassette loadlock 12, degas wafer orientation chamber 20, preclean chamber 24, PVD TiN chamber 22 and cooldown chamber 26. The robot blade 17 is illustrated in the retracted position for rotating freely within the chamber 18.

A second robot 28 is located in transfer chamber 30 to transfer substrates between various chambers, such as the cooldown chamber 26, preclean chamber 24, CVD Al chamber (not shown) and a PVD AlCu processing chamber (not shown). The specific configuration of the chambers illustrated in FIG. 1 comprises an integrated processing system capable of both CVD and PVD processes in a single cluster tool. A microprocessor controller 29 is provided to control the fabricating process sequence, conditions within the cluster tool, and the operation of the robots 14, 28.

FIG. 2 is a schematic view of the magnetically coupled robot of FIG. 1 shown in both the retracted and extended positions. The robot 14 (see FIG. 1) includes a first strut 81 rigidly attached to a first magnet clamp 80 and a second strut 82 rigidly attached to a second magnet clamp 80'. A third strut 83 is attached by a pivot 84 to strut 81 and by a pivot 85 to a wafer blade 86. A fourth strut 87 is attached by a pivot 88 to strut 82 and by a pivot 89 to wafer blade 86. The structure of struts 81-83, 87 and pivots 84, 85, 88, and 89 form a "frog leg" type connection of wafer blade 86 to magnet clamps 80,80'.

When magnet clamps 80,80' rotate in the same direction with the same angular velocity, then the robot also rotates about axis x in this same direction with the same velocity. When magnet clamps 80, 80' rotate in opposite directions with the same absolute angular velocity, then there is no rotation of assembly 14, but instead there is linear radial movement of wafer blade 86 to a position illustrated by dashed elements 81'-89'.

A wafer 35 is shown being loaded on wafer blade 86 to illustrate that the wafer blade can be extended through a wafer transfer slot 810 in a wall 811 of a chamber 32 to transfer such a wafer into or out of the chamber 32. The mode in which both motors rotate in the same direction at the same speed can be used to rotate the robot from a position suitable for wafer exchange with one of the adjacent chambers 12, 20, 22, 24, 26 (see FIG. 1) to a position suitable for wafer exchange with another of these chambers. The mode in which both motors rotate with the same speed in opposite directions is then used to extend the wafer blade into one of these chambers and then extract it from that chamber. Some other combination of motor rotation can be used to extend or retract the wafer blade as the robot is being rotated about axis x.

To keep wafer blade 86 directed radially away from the rotation axes x, an interlocking mechanism is used between the pivots or cams 85, 89 to assure an equal and opposite angular rotation of each pivot. The interlocking mechanism may take on many designs. One possible interlocking mechanism is a pair of intermeshed gears 92 and 93 formed on the pivots 85 and 89. These gears are loosely meshed to minimize particulate generation by these gears. To eliminate play between these two gears because of this loose mesh, a weak spring 94 (see FIG. 4) may be extended between a point 95 on one gear to a point 96 on the other gear such that the spring tension lightly rotates these two gears in opposite directions until light contact between these gears is produced.

Although robots of the type depicted in U.S. Pat. No. 6,222,337 (Kroeker et al.) have some desirable properties, robots of this type also have some shortcomings In particular, it has been found that robots of this type often suffer excessive wear in the hub assembly 14 and in the wrist 85', 89' and elbow 84', 88' joints, and exhibit deviations from parallelism between the opposing arms. These problems result in excessive maintenance requirements and in deviations in the manufacturing process. There is thus a need in the art for a robotic hub assembly and a robot incorporating the same which overcome these infirmities. There is further a need in the art for a method for making such robots and hub assemblies. These and other needs are met by the devices and methodologies disclosed herein and hereinafter described.

SUMMARY OF THE INVENTION

In one aspect, a robotic hub assembly is provided which comprises first and second spacers disposed in opposing relation to each other, and a device, such as a plurality of pins, for restricting the relative motion of the first and second spacers in a lateral direction. The device preferably comprises first and second sets of pins which extend through the first and second spacers. Preferably, the first set of pins extend through holes in the first spacer and rotatingly engage threaded apertures provided in said second spacer, and the second set of pins extend through holes in said second spacer and rotatingly engage threaded apertures provided in said first spacer.

In another aspect, a robot is provided which comprises first and second bearing rings; a hub assembly comprising (a) first and second spacers disposed between said first and second bearing rings and in opposing relation to each other, and (b) a set of pins adapted to restrict the relative motion of the first and second spacers in a lateral direction; and first and second arms attached, respectively, to said first and second bearing rings.

In still another aspect, a robot is provided which comprises a hub; first and second rings which are rotatably mounted on said hub; a spacer structure disposed between said first and second rings, wherein said spacer structure comprises first and second spacer elements have a plurality of springs disposed between them, and wherein said first and second spacer elements have at least one pin disposed between them; and first and second arms attached, respectively, to said first and second rings.

One skilled in the art will appreciate that the various aspects of the present disclosure may be used in various combinations and sub-combinations, and each of those combinations and sub-combinations is to be treated as if specifically set forth herein.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Some or all of the aforementioned needs may be met by the devices and methodologies disclosed herein. In particular, after careful investigation, it has now been found that, in conventional robotic arms of the type illustrated in FIGS. 1-4, the hub assembly can undergo nutation (that is, its components can move out of concentricity) and force the lower arm to roll away from the rotating hub axis. For example, in such a configuration, the hub assembly contains two rotatable bearing rings, each of which is attached to one of the arms, and these rings are separated by a spacer structure having opposing (typically annular) spacer elements. In use, these spacer elements can deviate from concentricity, thus causing the aforementioned roll.

In a frog-leg construction such as that depicted in FIGS. 1-4, this roll is transferred along the beam of the lower arm such that the arm is now out of parallelism with the second half of the robotic arm. This condition induces stress within the wrist, elbow and hub assembly of the robot, thus causing premature wear and adding abnormal motions in the z-direction (the direction perpendicular to the plane in which the arms extend and retract) as the arms are in motion. The devices and methodologies disclosed herein provide a means for eliminating this roll, thus preventing such premature wear and allowing the robotic arms to operate properly.

FIGS. 5-8 illustrate one particular, non-limiting embodiment of a spacer assembly 201 for a robotic hub made in accordance with the teachings herein. Some of the details of the spacer assembly 201 in this embodiment have been eliminated for simplicity of illustration. The spacer assembly 201 depicted is usable in a robot of the type depicted in FIGS. 1-4, and comprises first 203 and second 205 opposing spacer elements (preferably spacer rings) which are preferably spaced apart from each other by a predetermined distance.

In the completed hub assembly 201, the first 203 and second 205 spacer elements are disposed between first and second bearing rings (not shown) which are rotatably seated on a hub (not shown), and an arm (not shown) of the robot is attached to each bearing ring. The spacer elements 203, 205 maintain the first and second bearing rings in a proper orientation with respect to each other. The first and second bearing rings rotate in the same direction when the robotic arms are to be moved in a lateral direction, and rotate in opposing directions when the robotic arms are to be extended or retracted.

Figure 24:
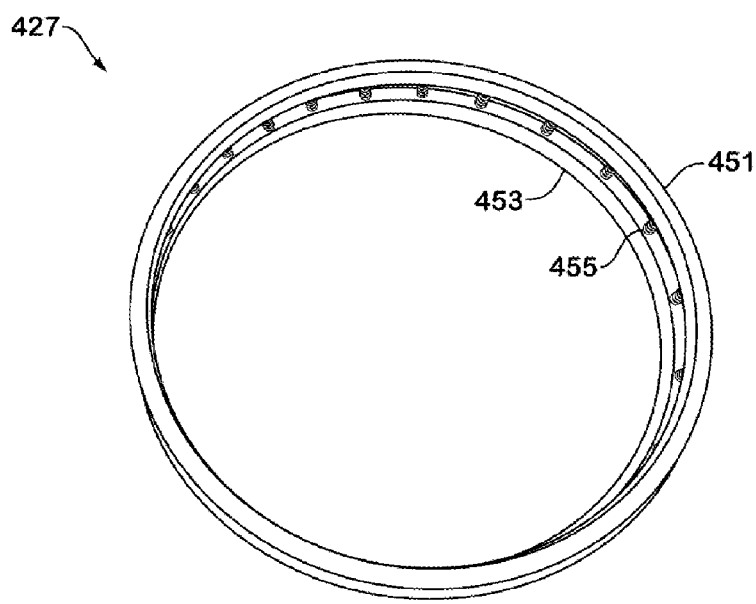
FIG. 24 is a perspective view of a prior art spring spacer for a robotic hub assembly.
Figure 25:
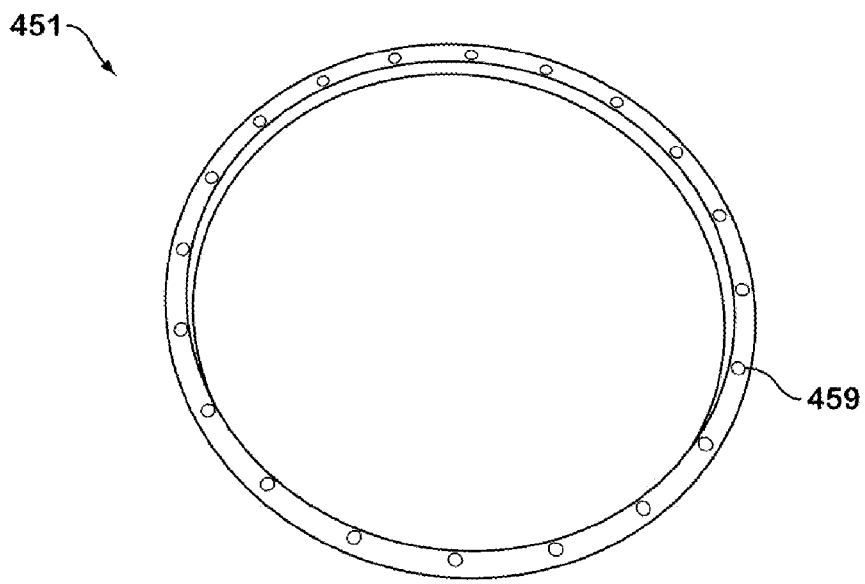
FIG. 25 is a perspective view of the top element of the spring spacer of FIG. 24.
Figure 26:
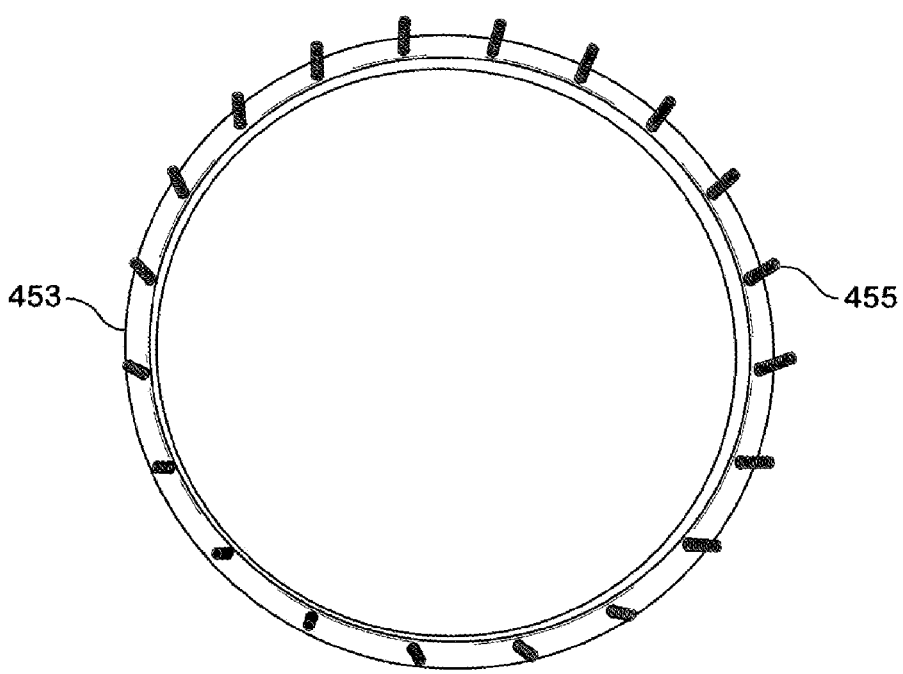
FIG. 26 is a perspective view of the bottom element of the spring spacer of FIG. 24.

As noted above, in robotic hub assemblies of the prior art (such as in the robots depicted in FIGS. 1-4) which contain spacer assemblies (one such prior art spacer assembly 427 is depicted in FIGS. 24-26, and is described in greater detail below), the opposing spacer elements often deviate from concentricity. This frequently happens, for example, when the two bearing rings rotate in opposite directions, and the resulting force pulls the spacer elements away from concentricity. This causes the robotic hub to undergo nutation, which places stress on the bearings inside the hub and causes premature wear. The spacer assembly 201 depicted in FIGS. 5-8 is adapted to eliminate such nutation. This configuration 201 utilizes a series of pins 211 to stiffen the spacer configuration, thereby eliminating lateral motion and maintaining the first 203 and second 205 spacer elements in a concentric relation to each other.

Figure 1:
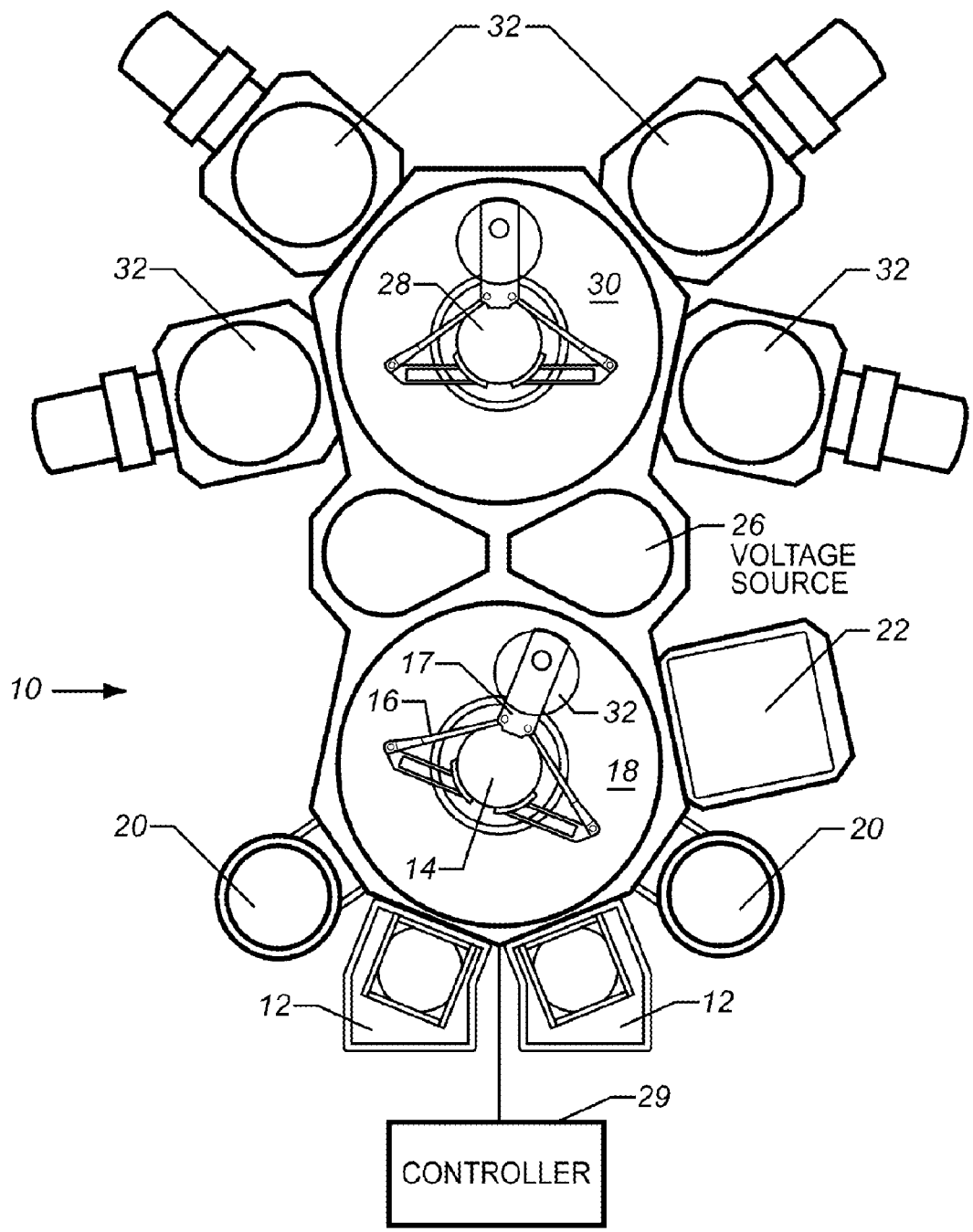
FIG. 1 is an illustration of a cluster tool equipped with a robotic wafer handling system.
Figure 2:
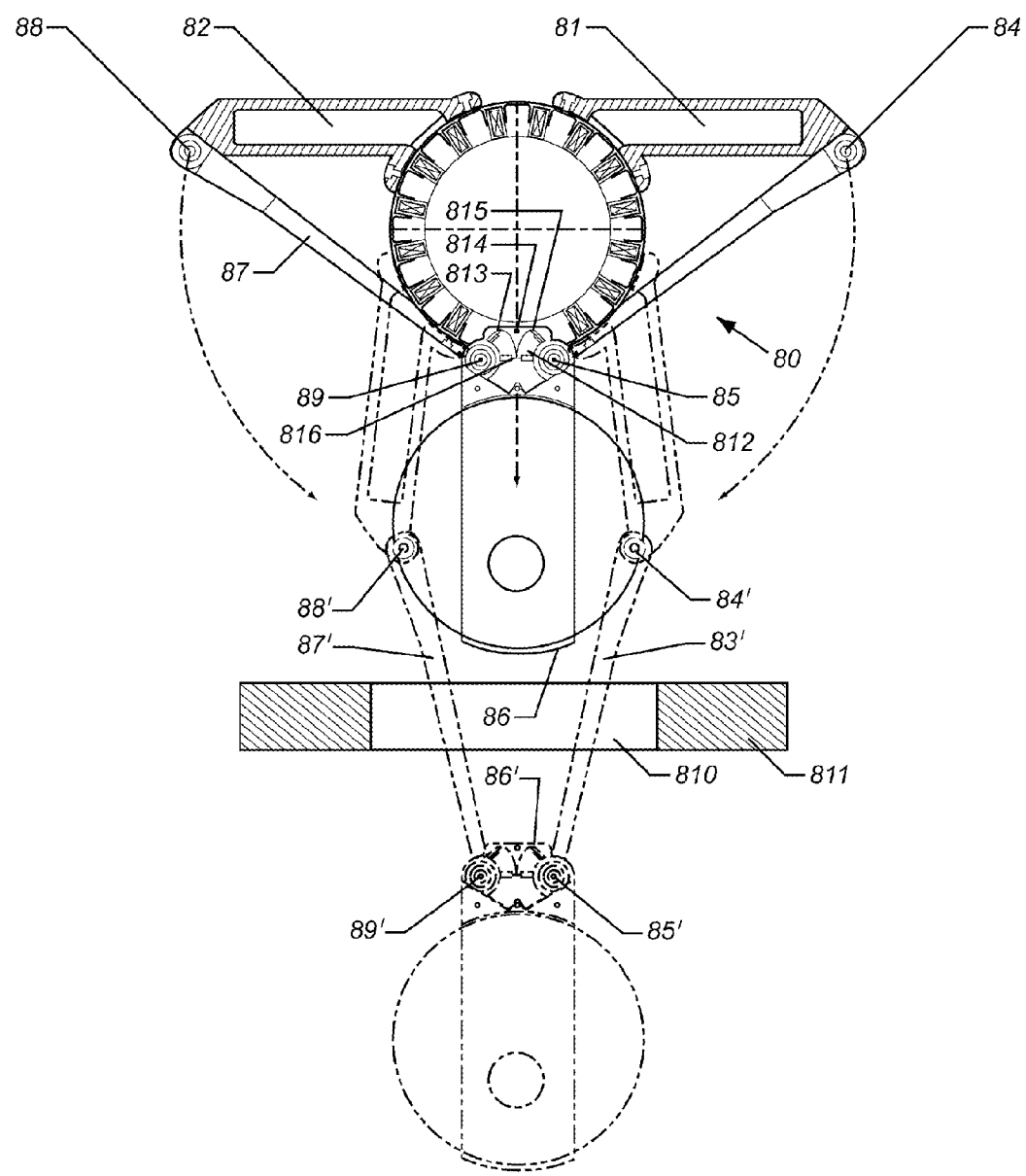
FIG. 2 is an illustration of the arm assembly of the robot depicted in FIG. 1, and illustrates the retracted and extended positions of the arm assembly.
Figure 3:
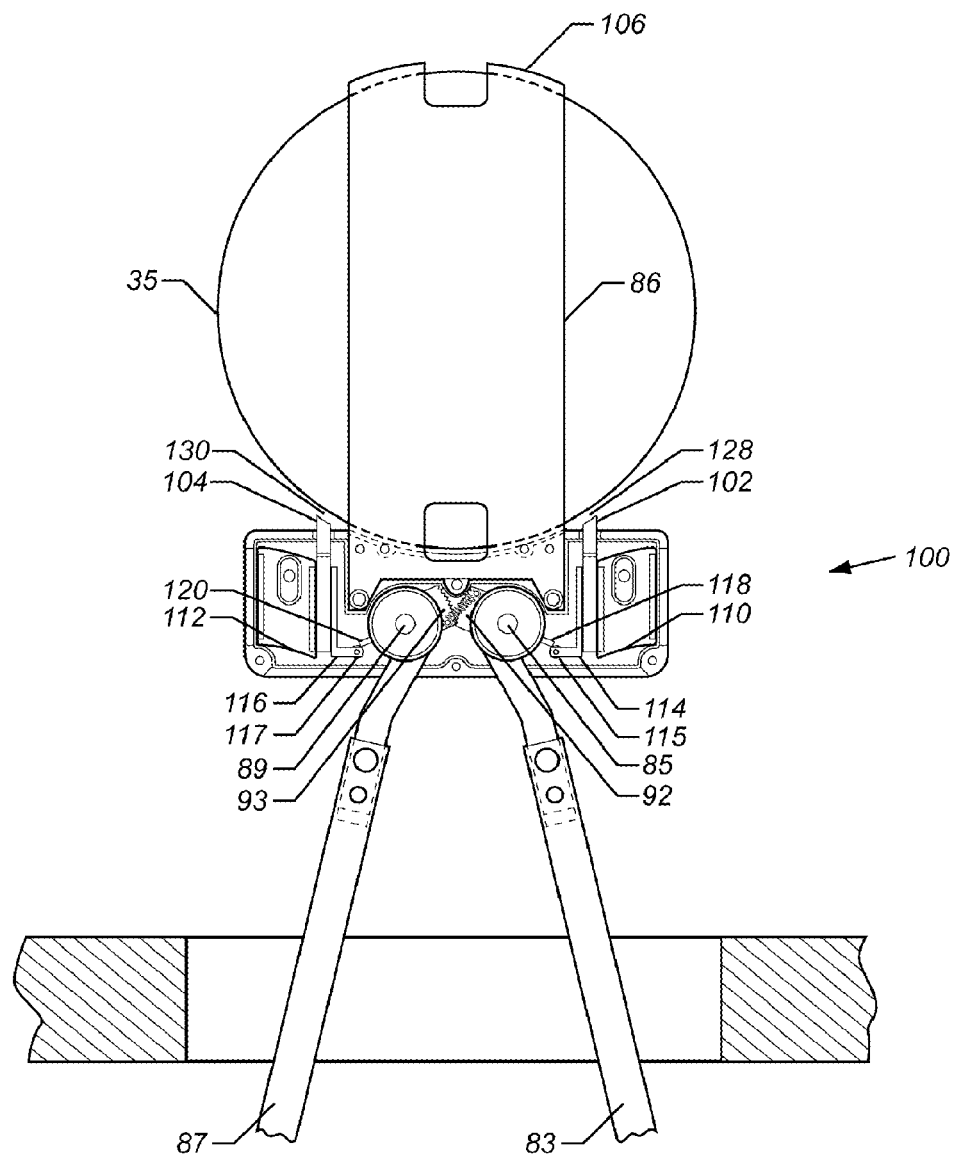
FIG. 3 is an illustration of the wrist assembly of the robot depicted in FIG. 1.
Figure 4:
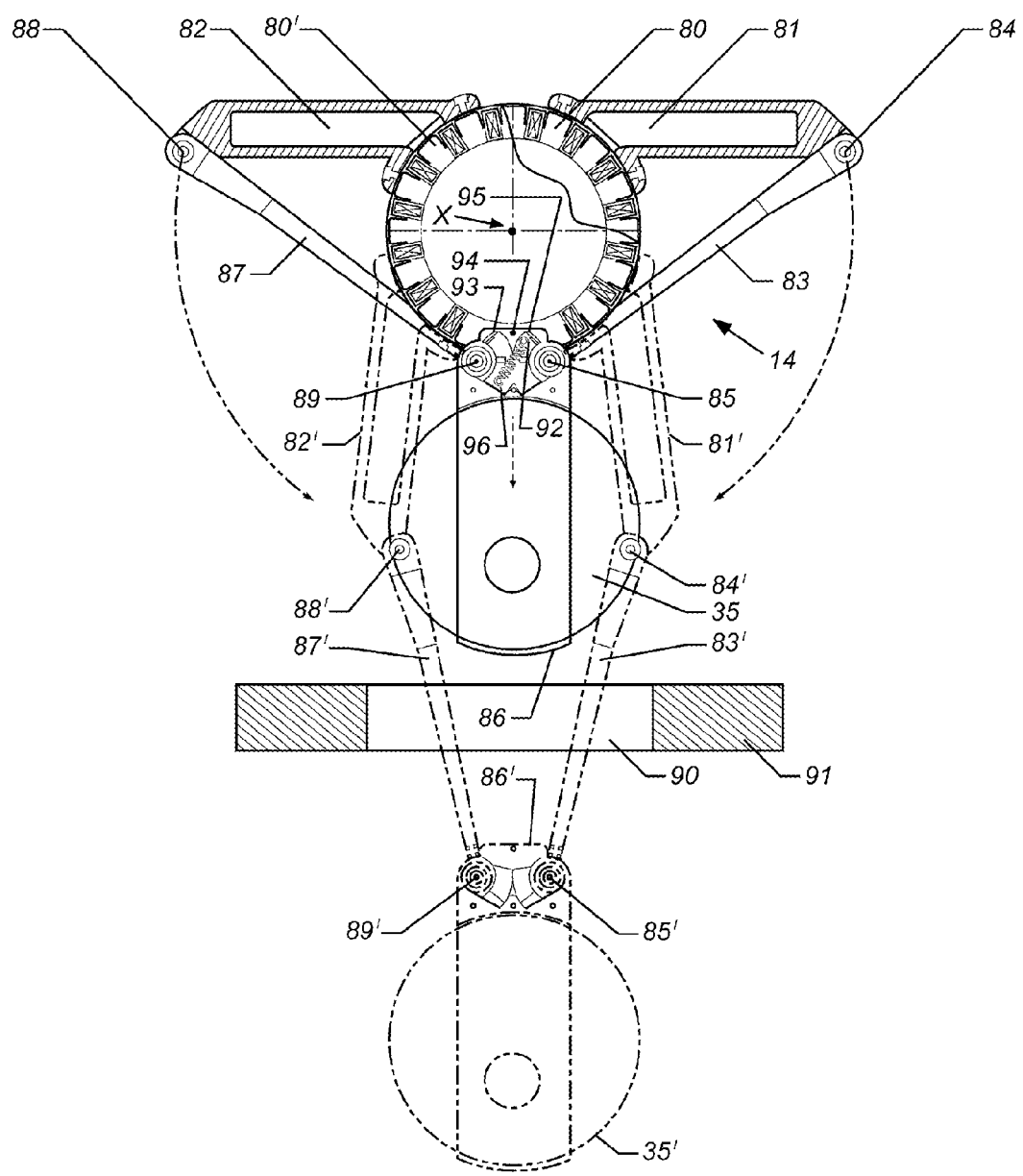
FIG. 4 is an illustration of a prior art robotic arm assembly which shows the assembly in the retracted and extended position.
Figure 5:
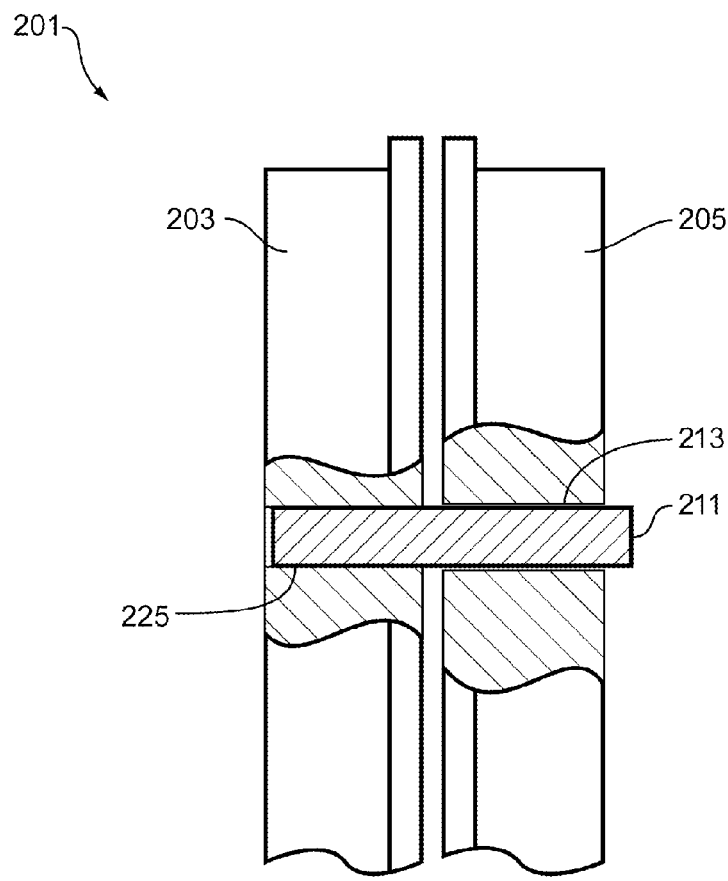
FIG. 5 is a side view of a robotic hub assembly, partially in section, made in accordance with the teachings herein.
Figure 6:
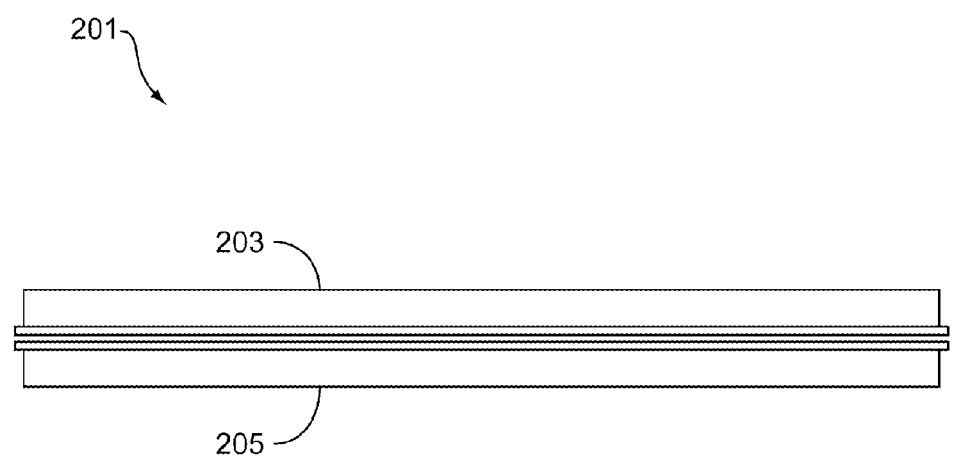
FIG. 6 is a side view of a robotic hub assembly made in accordance with the teachings herein.
Figure 7:
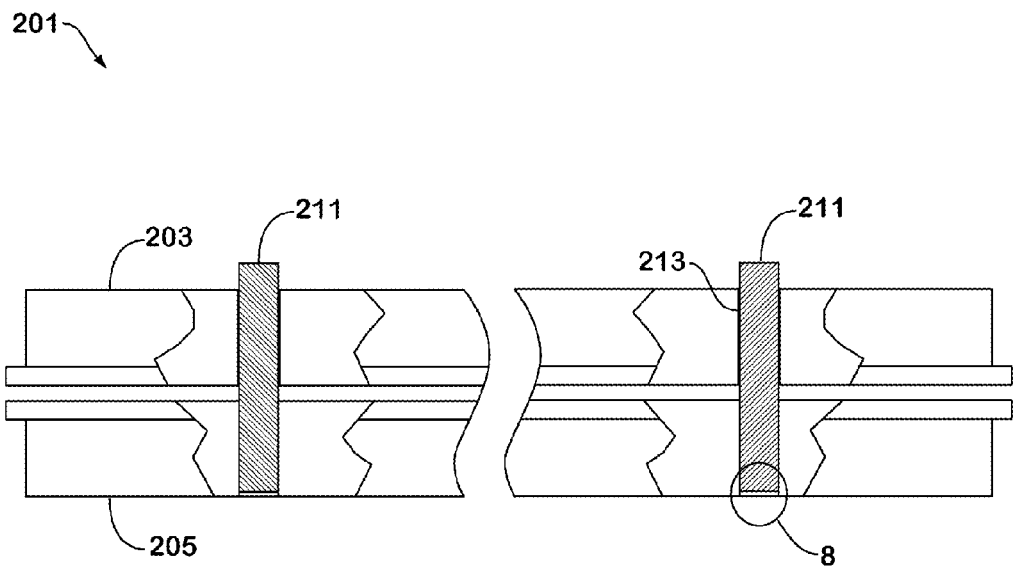
FIG. 7 is a side view of a robotic hub assembly, partially in section, made in accordance with the teachings herein.
Figure 8:
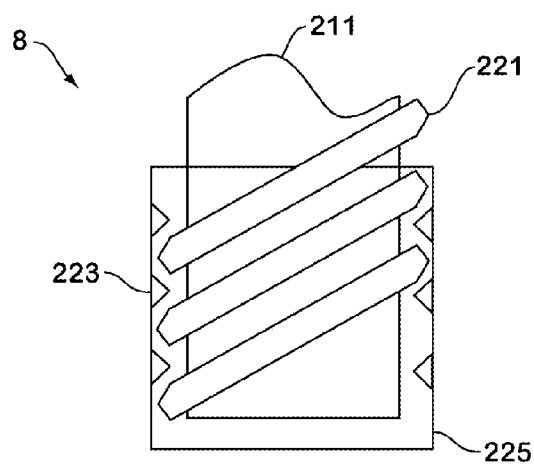
FIG. 8 is a magnified view of REGION 8 of FIG. 7.

As best seen in FIGS. 5 and 7-8, through holes 213 are provided for the pins 211 in the second 205 spacer element, and are constructed such that the second spacer element 205 can move about the pins 211 in a vertical direction, but is restricted by the pins 211 from moving in the lateral direction (that is, the direction perpendicular to the longitudinal axis of the pins 211). In one particular embodiment, for example, the pins 211 are 18/8 hardened steel pins, and the through holes 213 are designed to permit motion of the second spacer element 205 of less than about 0.001 inches in the lateral direction. Preferably, the through holes 213 are designed to permit motion of the second spacer element 205 within the range of about $1 \times 10^{-3}$ inches to about $1 \times 10^{-4}$ inches.

As seen in FIG. 8, the opposing end of each pin 211 may be provided with threads 221 which rotatably engage a set of complimentary threads 223 disposed in an aperture 225 provided in the second spacer element 205, thereby retaining the pins 211 in place. Of course, it will be appreciated that other means of securing the pin 211 in the aperture 225 may also be used.

The pins 211 may be disposed in various manners and arrangements with respect to the spacer elements 203, 205. Preferably, however, four pins are utilized, with the pins being spaced about 90° apart in spacer elements 203, 205. It is also preferred that the pins 211 are arranged in pairs such that the pins from different pairs are faced in opposing directions, and such that each of the pins in a pair are disposed on opposite sides of a spacer element. Preferably, each member of a first pair of the pins 211 is rotatingly engaged to apertures 225 disposed in the first spacer element 203, and each member of a second pair of the pins 211 is rotatingly engaged to apertures 225 disposed in the second spacer element 205.

For sake of further clarity, the foregoing devices and methodologies will now be described in greater detail. With reference to FIG. 7, a first particular, non-limiting embodiment of a robot 301 is depicted therein which has a frog-leg construction and which is made in accordance with the teachings herein. The robot 301 comprises a central hub 303 having a motor 305 mounted thereon, and a pair of arms 307, 309 extending from the hub 303. Each arm 307, 309 comprises an upper arm 311 and a lower arm 313. Each upper arm 311 terminates in a plate 315 which is attached to one of first 321 and second 323 magnetically driven, rotatable rings (see FIG. 10) in the hub assembly 303 with a series of bolts 317, while each lower arm 313 is attached on one end to an end effector (not shown), and is attached on the other end to an upper arm 311 by way of a rotatable joint. The two upper arms 311 may or may not be identical. Similarly, the two lower arms 313 may or may not be identical.

Figure 9:
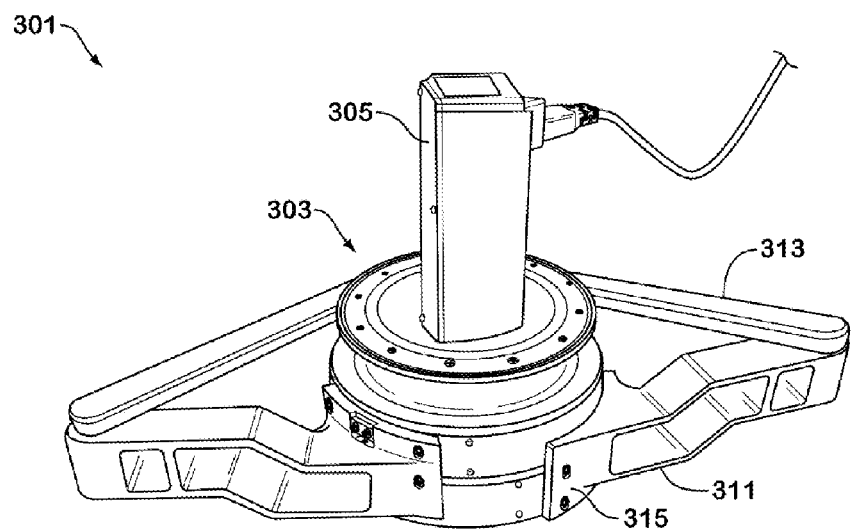
FIG. 9 is a perspective view of a robot including a hub assembly.
Figure 10:
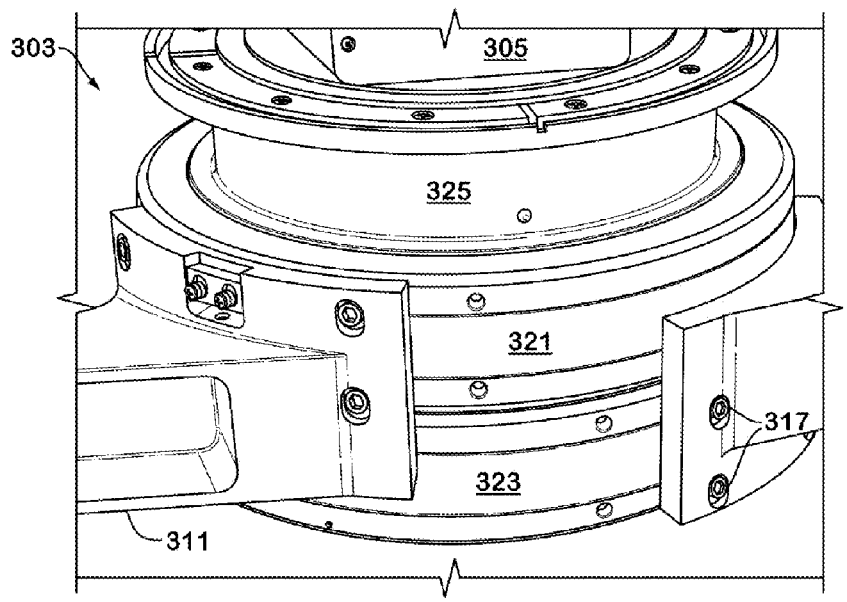
FIG. 10 is a close-up view of the hub assembly of the robot of FIG. 9.

The features of the hub assembly 303 may be further appreciated with respect to FIGS. 9-19, which depict the hub assembly 303 in various degrees of disassembly. FIGS. 9-10 show the hub assembly 303 with the robotic arms 307, 309 (see FIG. 7) removed (note that the hub assembly 303 is inverted in these figures with respect to its orientation in FIGS. 7-8). As best seen in FIG. 9, the hub assembly 303 comprises first 321 and second 323 magnetically driven, rotatable rings which are disposed about a (preferably cylindrical) hub 325 (see FIGS. 15-16). The first 321 and second 323 rings are spaced apart by a spacer structure 327 (see FIGS. 17-21), and are held in position on the hub 325 by way of a cap 329 (see FIGS. 9-10), which is secured to the hub 325 with a plurality of fasteners 331 (see FIG. 12).

Figure 11:
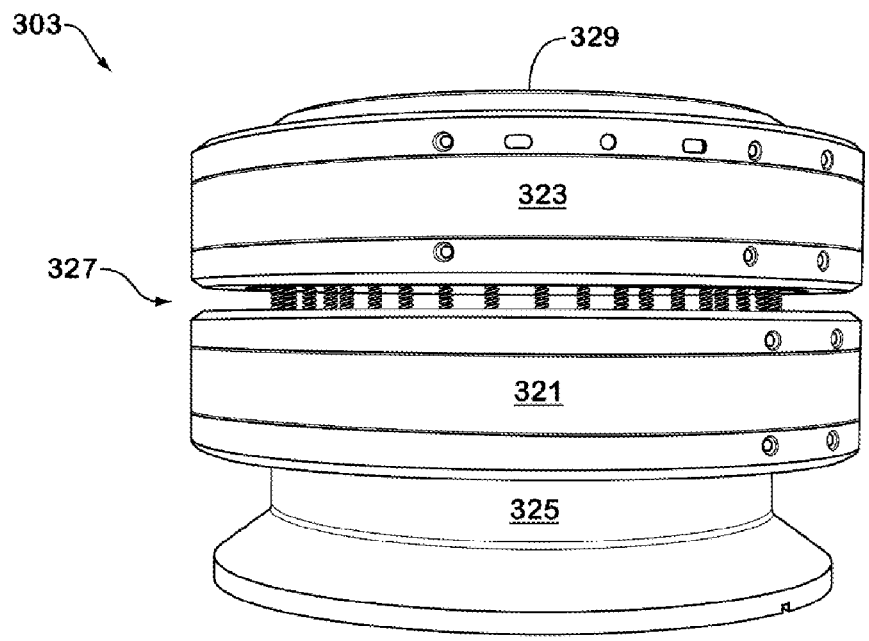
FIG. 11 is a side view of the hub assembly of FIG. 10 with the robotic arms removed.
Figure 12:
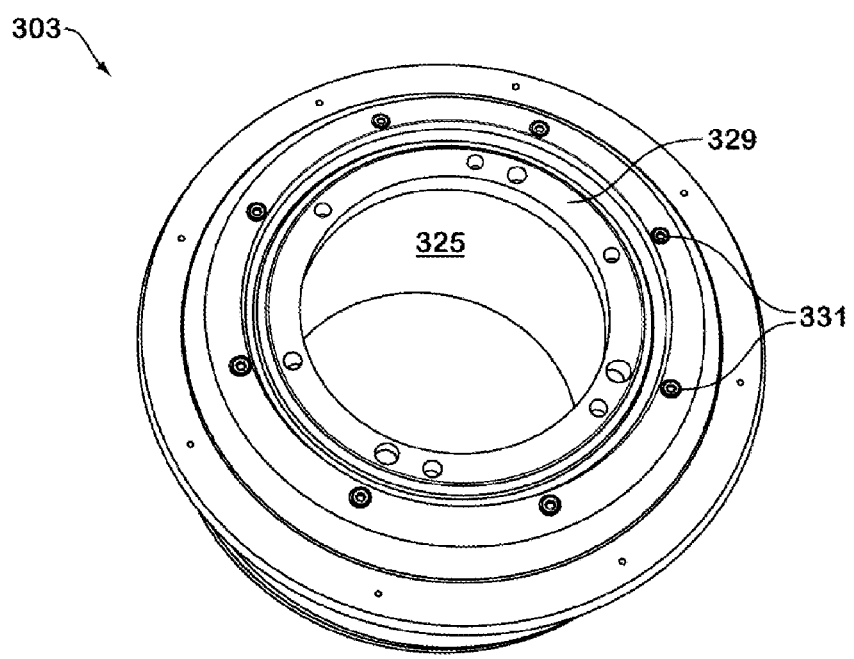
FIG. 12 is a perspective view of the hub assembly of FIG. 11.
Figure 13:
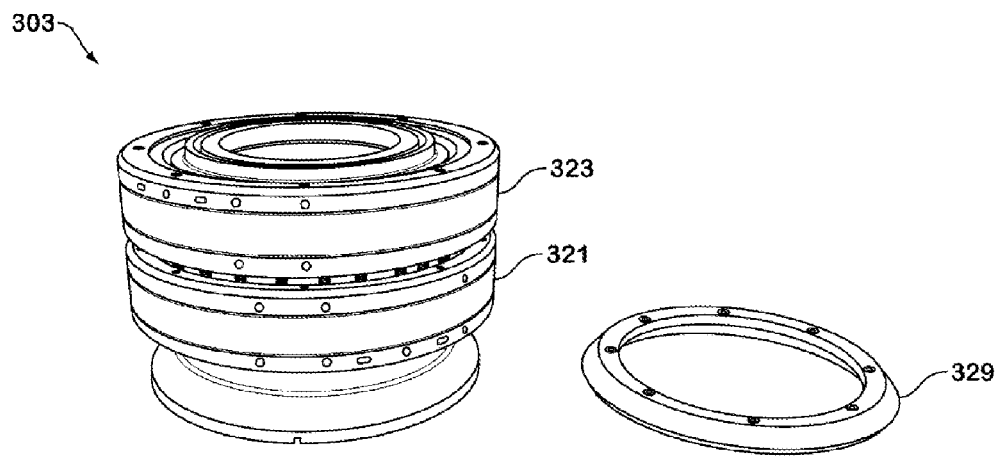
FIG. 13 is a perspective view of the hub assembly of FIG. 11 with the locking ring removed.
Figure 14:
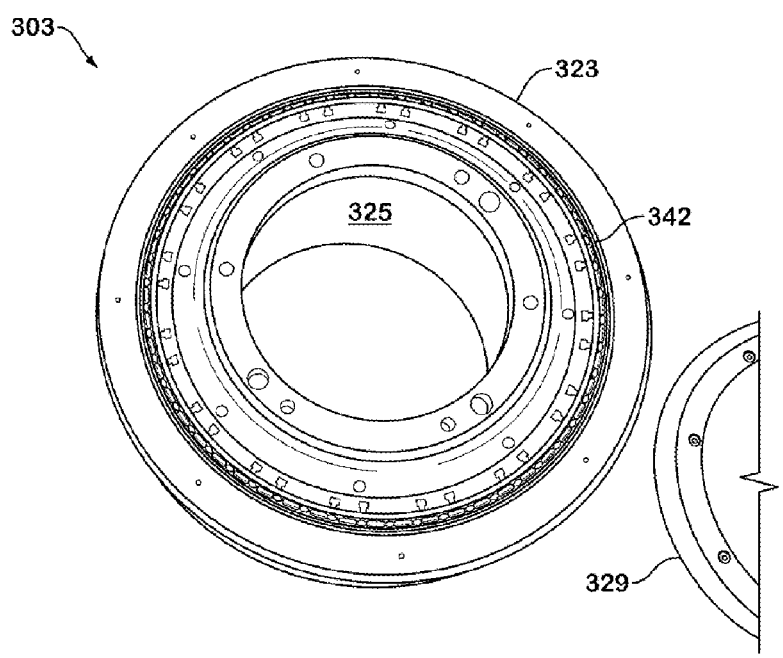
FIG. 14 is a perspective view of the hub assembly of FIG. 11 with the locking ring removed.
Figure 15:
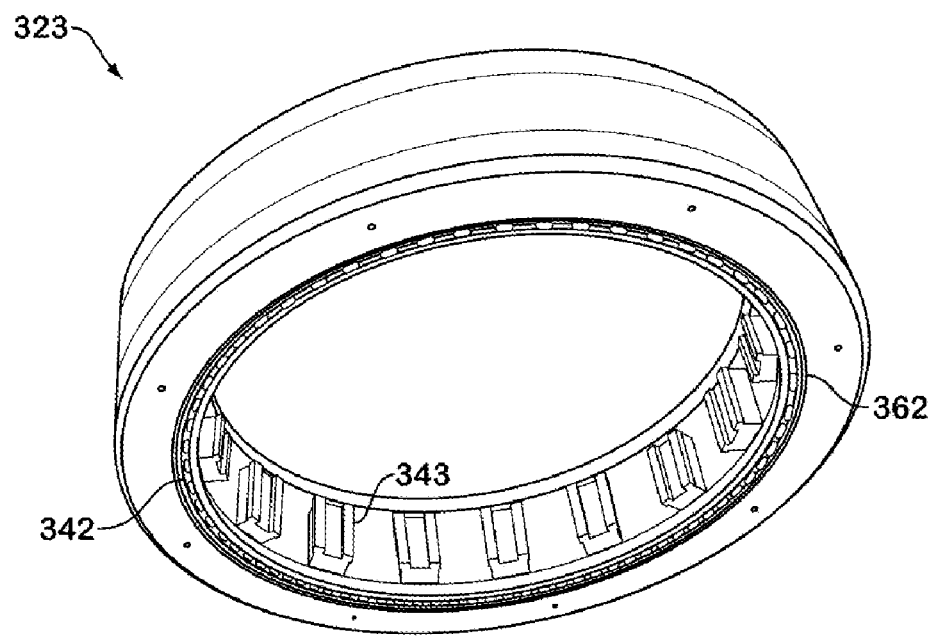
FIG. 15 is a perspective view of one of two magnetic rings in the hub assembly of FIG. 11.

FIGS. 11-12 depict the hub assembly 303 with the cap 329 removed. As seen therein, each of the first 321 and second 323 rings is equipped with ball bearing assemblies 341 which allow the rings 321, 323 to rotate freely around the hub 303. As seen in FIG. 15, the rings 321, 323 are fitted along their inner surface with a plurality of magnets 343 which interact with each other and/or with one or more electromagnets, permanent magnets or coils (not shown) to induce rotation in the rings 321, 323.

Figure 16:
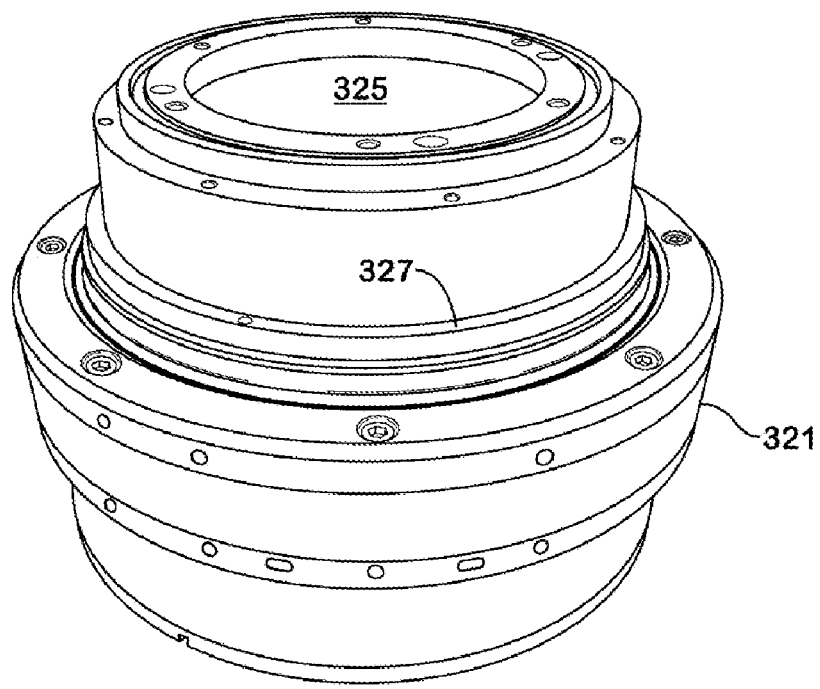
FIG. 16 is a perspective view of the hub assembly of FIG. 11 with the locking ring and upper magnetic ring removed.
Figure 17:
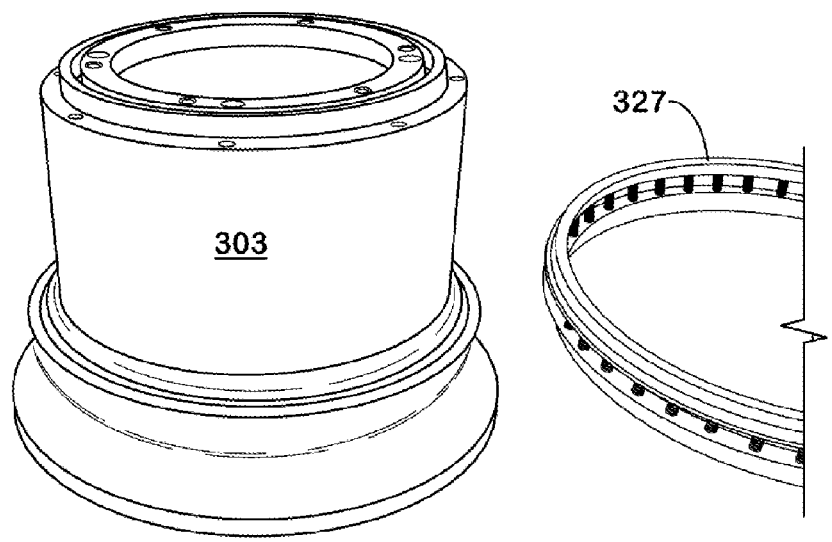
FIG. 17 is a perspective view of the hub assembly of FIG. 11 with the locking ring, upper magnetic ring, spring spacer, and lower magnetic ring removed.
Figure 18:
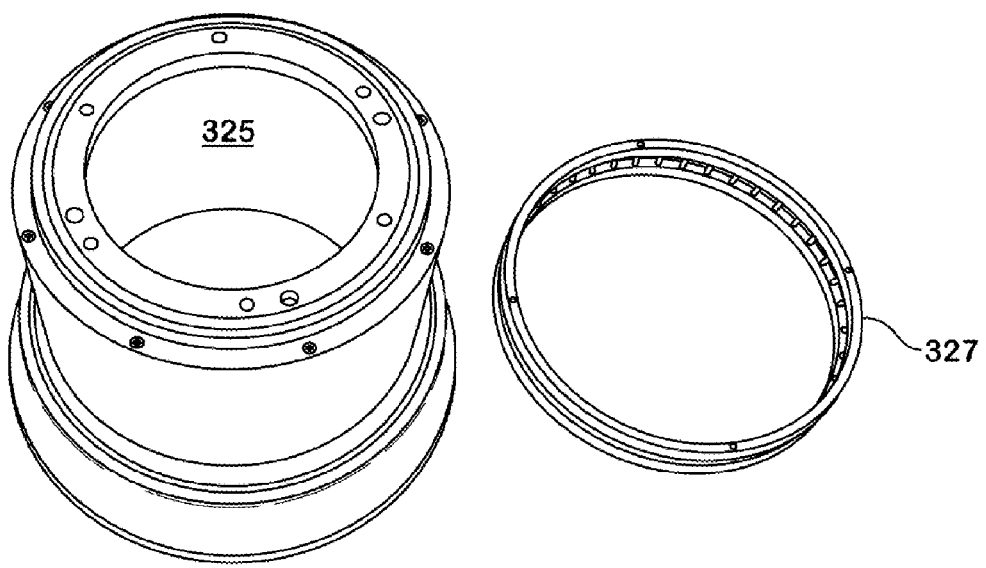
FIG. 18 is a perspective view of the hub assembly of FIG. 11 with the locking ring, upper magnetic ring, spring spacer, and lower magnetic ring removed.
Figure 19:
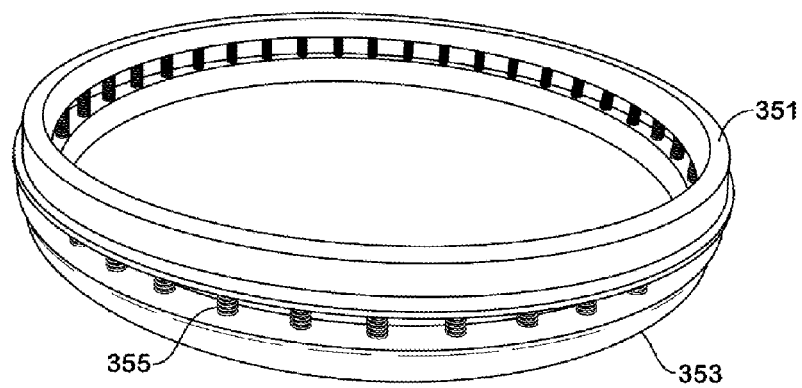
FIG. 19 is a perspective view of the spring spacer of the hub assembly of FIG. 11.
Figure 20:
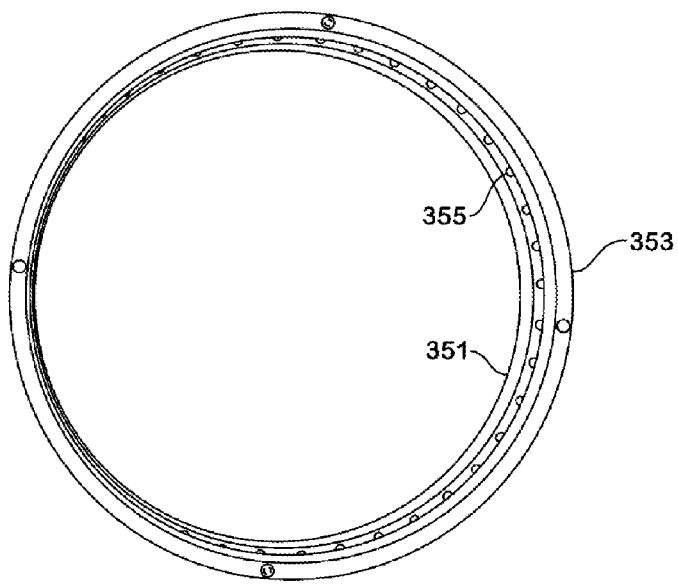
FIG. 20 is a perspective view of the spring spacer of the hub assembly of FIG. 11.
Figure 21:
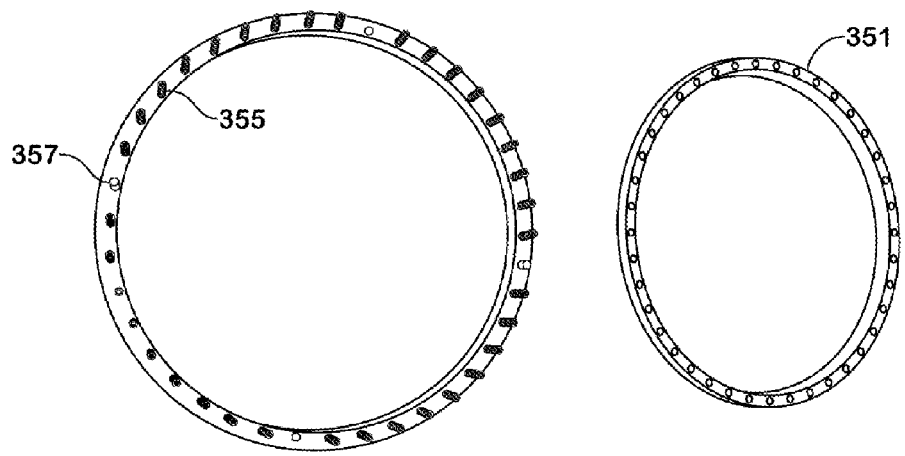
FIG. 21 is a perspective view of the spring spacer of the hub assembly of FIG. 11 with the top element removed.
Figure 22:
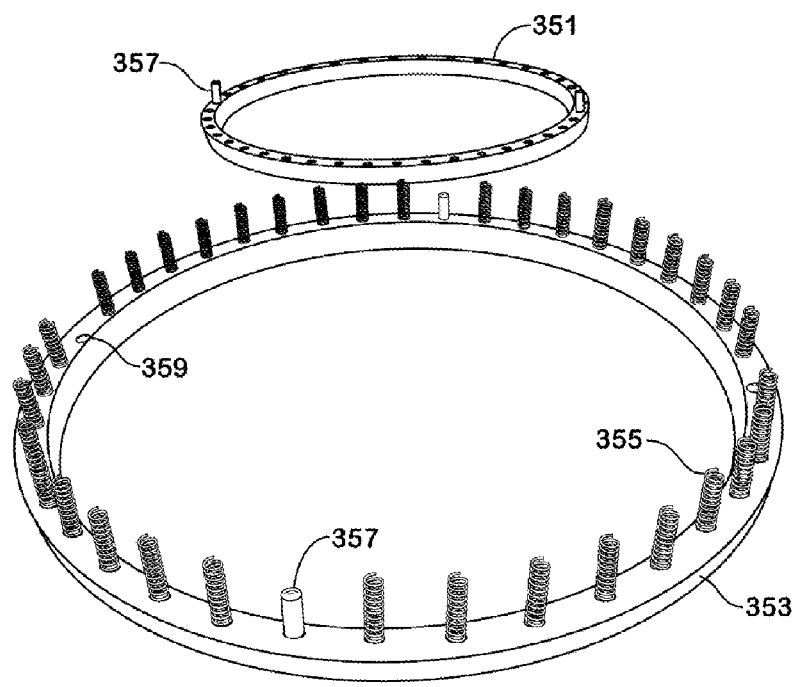
FIG. 22 is a perspective view of the bottom element of the spring spacer of the hub assembly of FIG. 11.
Figure 23:
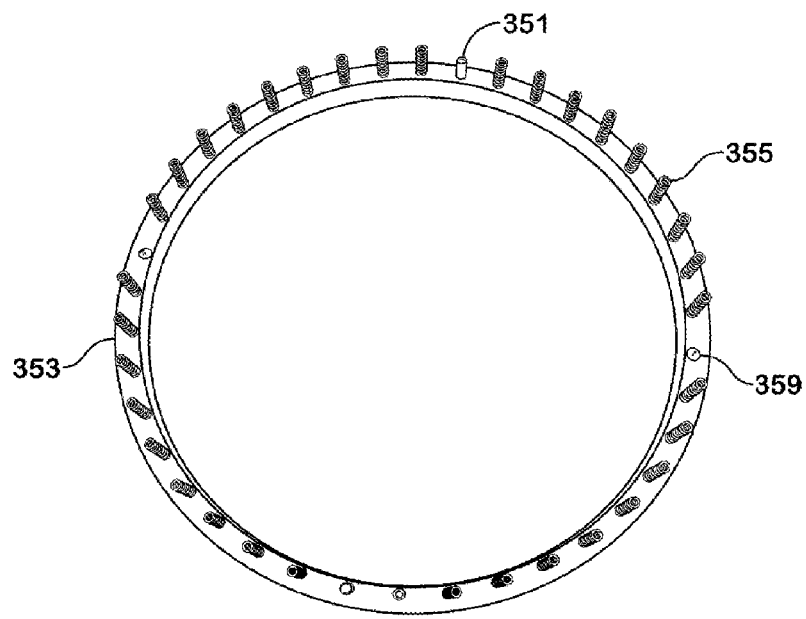
FIG. 23 is a perspective view of the top element of the spring spacer of the hub assembly of FIG. 11.

With reference to FIGS. 19-22, spacer structure 327 comprises first 351 and second 353 annular elements which are joined together by a series of springs 355. As seen in FIGS. 15-16, the inner surfaces of the first 351 and second 353 annular elements of the spacer structure 327 sit flush against the hub 325. In the hub assembly 303, the second annular element 353 (see FIG. 19) engages a beveled indentation 362 on the surface of the second ring 323 in the vicinity of the ball bearing assembly 342. The first annular element 351 engages the surface of the first ring 321 in a similar manner. This arrangement ensures that the first 321 and second 323 rings are held snugly in place, while the springs 355 (see FIGS. 17-18) provide a resistive force that ensures that the first 321 and second 323 rings are spaced apart from each other. The springs 355 further serve to absorb shock and help to maintain the concentricity of the first 321 and second 323 rings.

FIGS. 19-23 illustrate the spacer structure 327 in greater detail. As seen therein, in addition to the springs 355, the spacer structure 327 is further equipped with a plurality of pegs or pins 357 which are preferably spaced at even intervals along the circumference of the first 351 and second 353 annular elements. The pins 357 serve to stiffen the hub assembly, thereby eliminating lateral motion and maintaining the first 321 and second 323 rings in a concentric relation to each other.

The through holes 359 for the pins in the spacer elements 351 and 353 are constructed such that the pins 357 can move in a vertical direction, but are restricted in their motion in the lateral direction (see, e.g., FIGS. 5 and 7-8). In one particular embodiment, for example, the pins 357 are preferably 18/8 hardened steel pins, and the through holes are preferably designed to permit motion of less than about 0.001 inches in the lateral direction. Preferably, the pins have a diameter which is less than the diameter of the through holes by an amount within the range of about $1.0\times10^{-3}$ to about $1\times10^{-4}$.

By contrast, comparable prior art spacer structures, such as the embodiment depicted in FIGS. 24-26, do not have such pins. Spacers 427 of this type are equipped with first 451 and second 453 annular elements which are connected only by springs 455. As previously noted, a construction of the type depicted in FIGS. 22-24 allows the rings of the robot to deviate from concentricity during use. This frequently happens, for example, when the rings rotate in opposite directions, and the resulting force pulls the first 451 and second 453 annular elements of the spacer 427 away from concentricity. This causes the hub to undergo nutation, which places stress on the bearings inside the hub and causes premature wear.

Although various devices and methodologies have been described in detail herein, it should be understood that various changes, substitutions and alterations can be made thereto without departing from the spirit and scope of the invention. Accordingly, the scope of the present invention should be construed with reference to the appended claims.

What is claimed is:

1. A robot, comprising:
   a hub;
   first and second rings which are rotatably mounted on said hub;
   a spacer structure disposed between said first and second rings, wherein said spacer structure comprises first and second spacer elements having a plurality of springs disposed between them, and wherein said first and second spacer elements have at least one pin disposed between them; and
   first and second arms attached, respectively, to said first and second rings.

2. The robot of claim 1, wherein said at least one pin restricts the motion of the first and second spacers in a direction perpendicular to a longitudinal axis of said hub.

3. The robot of claim 1, wherein said at least one pin restricts lateral motion of the first and second spacers.

4. The robot of claim 3, wherein said first and second pins are disposed on opposing sides of said first ring.

5. The robot of claim 1, wherein said at least one pin includes first and second pins.

6. The robot of claim 1, wherein said at least one pin includes first, second, third and fourth pins, wherein said first and second pins are disposed on opposing sides of said first ring, and wherein said third and fourth pins are disposed on opposing sides of said second ring.

7. The robot of claim 1, wherein said at least one pin rotatingly engages a first threaded aperture disposed in said first ring, and extends into a second aperture disposed in said second ring.

8. The robot of claim 7, wherein said second aperture slidingly engages said at least one pin.

9. The robot of claim 7, wherein the at least one pin moves freely in said second aperture in a direction parallel to a longitudinal axis of the at least one pin.

10. The robot of claim 1, wherein said spacer maintains said first and second rings in a spaced apart relationship.

11. The robot of claim 1, wherein said first ring has a first edge which engages a beveled surface on said first ring, and wherein said second ring has a second edge which engages a beveled surface on said second ring.

12. The robot of claim 1, wherein said first ring is equipped with a first ball bearing assembly, and wherein said second ring is equipped with a second ball bearing assembly.

13. The robot of claim 12, wherein said first and second arms have a frog-leg configuration.

14. The robot of claim 12, wherein said first and second arms extend when said first and second rings rotate in first and second opposing directions, respectively.

15. The robot of claim 14, wherein said first and second arms retract when said first and second rings rotate in third and fourth opposing directions, respectively, wherein said third direction is opposite of said first direction, and wherein said third direction is opposite of said second direction.

16. The robot of claim 12, wherein said hub is cylindrical.

17. The robot of claim 1, wherein said first arm includes a first upper arm and a first lower arm.

18. The robot of claim 17, wherein said second arm includes a second upper arm and a second lower arm.

19. The robot of claim 18, wherein said first and second lower arms are attached to a wrist assembly.

20. The robot of claim 19, wherein said wrist assembly is connected to an end effector.

21. The robot of claim 18, wherein said first upper arm is connected to said first ring, and wherein said second upper arm is connected to said second ring.

* * * * *